(12) United States Patent
Mostafazadeh et al.

(10) Patent No.: US 7,144,800 B2
(45) Date of Patent: Dec. 5, 2006

(54) MULTICHIP PACKAGES WITH EXPOSED DICE

(75) Inventors: Shahram Mostafazadeh, San Jose, CA (US); Joseph O. Smith, Morgan Hill, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 141 days.

(21) Appl. No.: 10/890,896

(22) Filed: Jul. 13, 2004

(65) Prior Publication Data

US 2004/0259288 A1 Dec. 23, 2004

Related U.S. Application Data

(62) Division of application No. 10/391,160, filed on Mar. 17, 2003, now Pat. No. 6,936,929.

(51) Int. Cl.
*H01L 21/00* (2006.01)
*H01L 23/495* (2006.01)
*H01L 23/02* (2006.01)
*H01L 29/40* (2006.01)

(52) U.S. Cl. ............... 438/598; 438/106; 438/107; 438/108; 438/109; 438/110; 438/111; 438/123; 257/686; 257/777; 257/778; 257/666

(58) Field of Classification Search ........... 438/107; 257/690
See application file for complete search history.

(56) References Cited

U.S. PATENT DOCUMENTS

| | | | |
|---|---|---|---|
| 5,216,283 A | 6/1993 | Lin | |
| 5,851,845 A * | 12/1998 | Wood et al. | 438/15 |
| 5,942,795 A * | 8/1999 | Hoang | 257/692 |
| 5,952,725 A * | 9/1999 | Ball | 257/777 |
| 6,133,637 A | 10/2000 | Hikita et al. | |
| 6,236,109 B1 | 5/2001 | Hsuan et al. | |
| 6,355,502 B1 * | 3/2002 | Kang et al. | 438/110 |
| 6,376,914 B1 | 4/2002 | Kovats et al. | |
| 6,555,917 B1 * | 4/2003 | Heo | 257/777 |
| 6,710,454 B1 * | 3/2004 | Boon | 257/777 |
| 6,791,195 B1 | 9/2004 | Urushima | |
| 6,812,552 B1 | 11/2004 | Islam et al. | |
| 6,815,833 B1 * | 11/2004 | Lee et al. | 257/778 |
| 6,936,929 B1 * | 8/2005 | Mostafazadeh et al. | 257/778 |
| 2002/0068373 A1 * | 6/2002 | Lo et al. | 438/33 |

(Continued)

OTHER PUBLICATIONS

"Tessara's Unique Approach to Stacked IC Packaging," downloaded from: http://www.tessara.com/images/news_events/Stacked_packaging_backgrounder_05-25-01.pdf on Feb. 4, 2003, 4 Pages.

*Primary Examiner*—Carl Whitehead, Jr.
*Assistant Examiner*—James Mitchell
(74) *Attorney, Agent, or Firm*—Beyer Weaver & Thomas LLP (57) ABSTRACT

Multichip packages and methods for making same. The present invention generally allows for either the back of a flipchip, the back of a mother die, or both to be exposed in a multichip package. When the mother die is connected to the package contacts, the back of the flip chip is higher than the electrical connections. Accordingly, the back of the flip chip can be exposed. Furthermore, if a temporary tape substrate is used with a leadframe panel that does not have a die attach pad, the package can be even thinner. Once the temporary tape substrate is removed, both the back of the flipchip and the back of the mother die will be exposed from the encapsulant.

8 Claims, 13 Drawing Sheets

U.S. PATENT DOCUMENTS

| | | |
|---|---|---|
| 2002/0151103 A1* | 10/2002 | Nakamura et al. .......... 438/106 |
| 2003/0057539 A1* | 3/2003 | Koopmans ................... 257/686 |
| 2003/0057564 A1* | 3/2003 | Leedy ........................ 257/777 |
| 2003/0071341 A1* | 4/2003 | Jeung et al. ................ 257/686 |
| 2004/0110323 A1* | 6/2004 | Becker et al. .............. 438/127 |

* cited by examiner

MULTICHIP PACKAGES WITH EXPOSED DICE

CROSS REFERENCE TO RELATED APPLICATIONS

This application is a Divisional of U.S. patent application Ser. No. 10/391,160 filed on Mar. 17, 2003 which is incorporated herein by reference now U.S. Pat. No. 6,936,929.

BACKGROUND OF THE INVENTION

1. Field of the Invention

The present invention relates generally to semiconductor packaging and more specifically to multichip semiconductor packaging.

2. Description of the Related Art

In an effort to produce smaller and lighter electrical devices there is a continuing effort to reduce the size of semiconductor components. Stacking multiple chips into a single package is one technique for reducing the footprint required for semiconductor devices.

Figure 1:
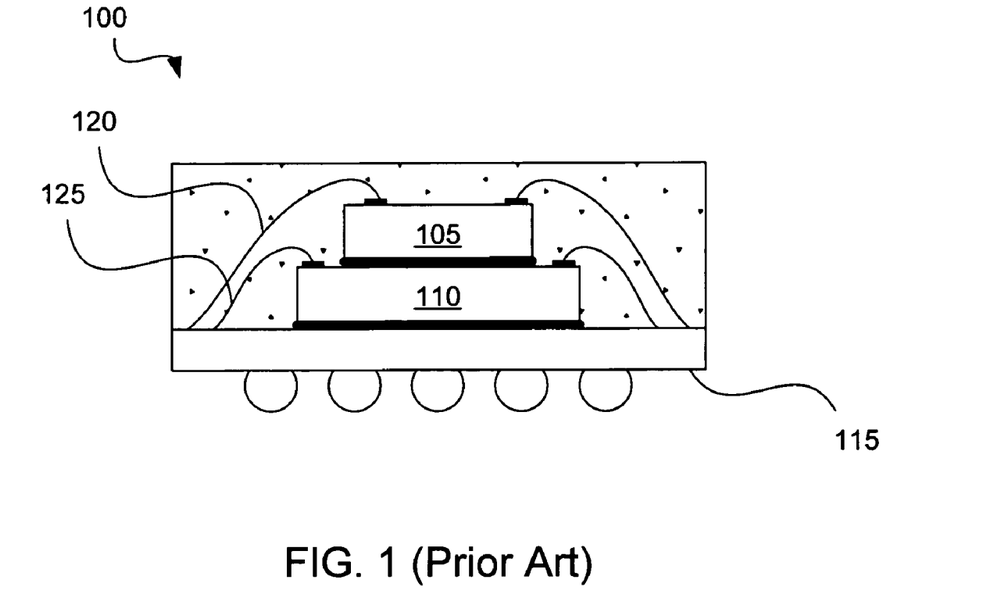
FIG. 1 is a diagrammatic cross sectional view of a prior art multichip package that allows both chips to have exclusive electrical connections to a BGA.

There are several methods of designing a stacked package. FIG. 1 is a diagrammatic cross sectional view of a common multichip package 100. Two dice 105 and 110 are each electrically connected to a substrate 115 via wire bonding 120 and 125. Each die 105 and 110 has an exclusive electrical link to the substrate 115. The multichip package 100 is arranged as a ball grid array ("BGA"), a type of package in which the input and output points are solder bumps arranged in a grid pattern.

Figure 2:
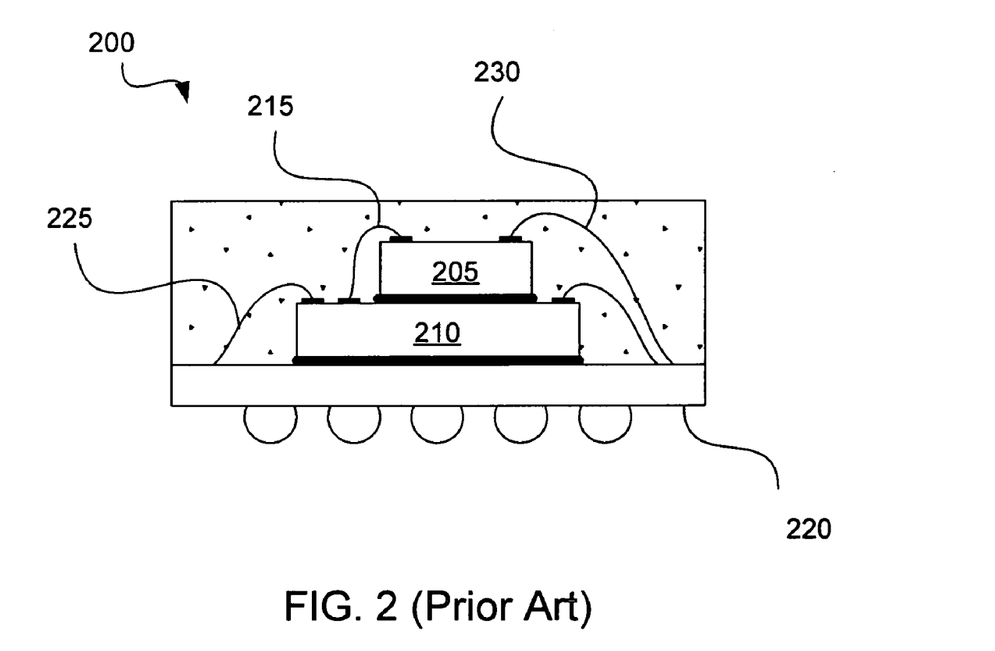
FIG. 2 is a diagrammatic cross sectional view of a prior art multichip package that allows a daughter die to be directly connected to a mother die in addition to both dice being connected to the BGA.

FIG. 2 is a diagrammatic cross sectional view of another multichip package 200. A daughter die 205 is directly connected to a mother die 210 via wire bonding 215. Both the daughter die 205 and the mother die 210 are also connected directly to the substrate 220 via wire bonding 225 and 230.

Although the described packages work well in many applications, there are continuing efforts to further improve multichip packages.

SUMMARY OF THE INVENTION

The present invention provides a multichip assembly that has a flipchip, a mother die, contacts and an encapsulant. The face of the mother die is adapted to receive the face of the flipchip such that the flipchip is in direct electrical contact with the mother die. The mother die is in electrical contact with the contacts, which are used to connect the dice with components external to the package. The encapsulant is formed around the flipchip, mother die, and contacts such that the contacts are partially exposed and the back of the flipchip is partially exposed. Ensuring that the height of the encapsulant does not exceed the flipchip is one way of exposing the back of the flipchip.

In another aspect, the multichip assembly is characterized as a quad flat packs—no lead package, whereby the contacts were from a leadless leadframe panel.

In another aspect, a multichip assembly includes a chip stack, contacts and an encapsulant. The chip stack (a mother die electrically connected to a daughter die) is in electrical contact with the contacts and the encapsulant partially encapsulates them both. Typically, the partially exposed portion of the chip stack is either the bottom of the chip stack (usually the back of the mother die), the top of the chip stack (usually the back of the daughter die) or both.

In a method aspect of the invention, the multichip assembly is created by first providing a semiconductor wafer that has an array of mother dice. Then, flipchips are electrically connected to the wafer. Next, the wafer is singulated to create individual chip stacks. The chip stacks are then electrically connected to contacts on a leadframe panel. Next, encapsulant is added to the chip stack and leadframe panel such that encapsulant does exceed the height of the chip stack. Finally the encapsulated chip stack and leadframe panel is singulated to create individual multichip assemblies.

BRIEF DESCRIPTION OF THE DRAWINGS

The invention may best be understood by reference to the following description taken in conjunction with the accompanying drawings in which.

DETAILED DESCRIPTION OF THE PREFERRED EMBODIMENTS

In the following description, numerous specific details are set forth to provide a thorough understanding of the present invention. It will be apparent, however, to one skilled in the art that the present invention may be practiced without some or all of these specific details. In other instances, well known process steps have not been described in detail in order to avoid unnecessarily obscuring the present invention.

The present invention generally allows for very thin multichip assemblies. Generally, a flipchip is first attached to a mother die so that only the mother die needs to be electrically connected with the package contacts. When the mother die is connected to the package contacts, the back of the flip chip is typically higher than the electrical connections. Since the encapsulant only needs to be high enough to fully encapsulate the means for electrical connection (e.g., gold wire bonds), the encapsulant does not need to cover the flip chip. Accordingly, the back of the flip chip can be exposed. Furthermore, if a temporary tape substrate is used with a leadframe panel that does not have a die attach pad, the package can be even thinner. Once the temporary tape substrate is removed, both the back of the flipchip and the back of the mother die will be exposed from the encapsulant.

Figure 3:
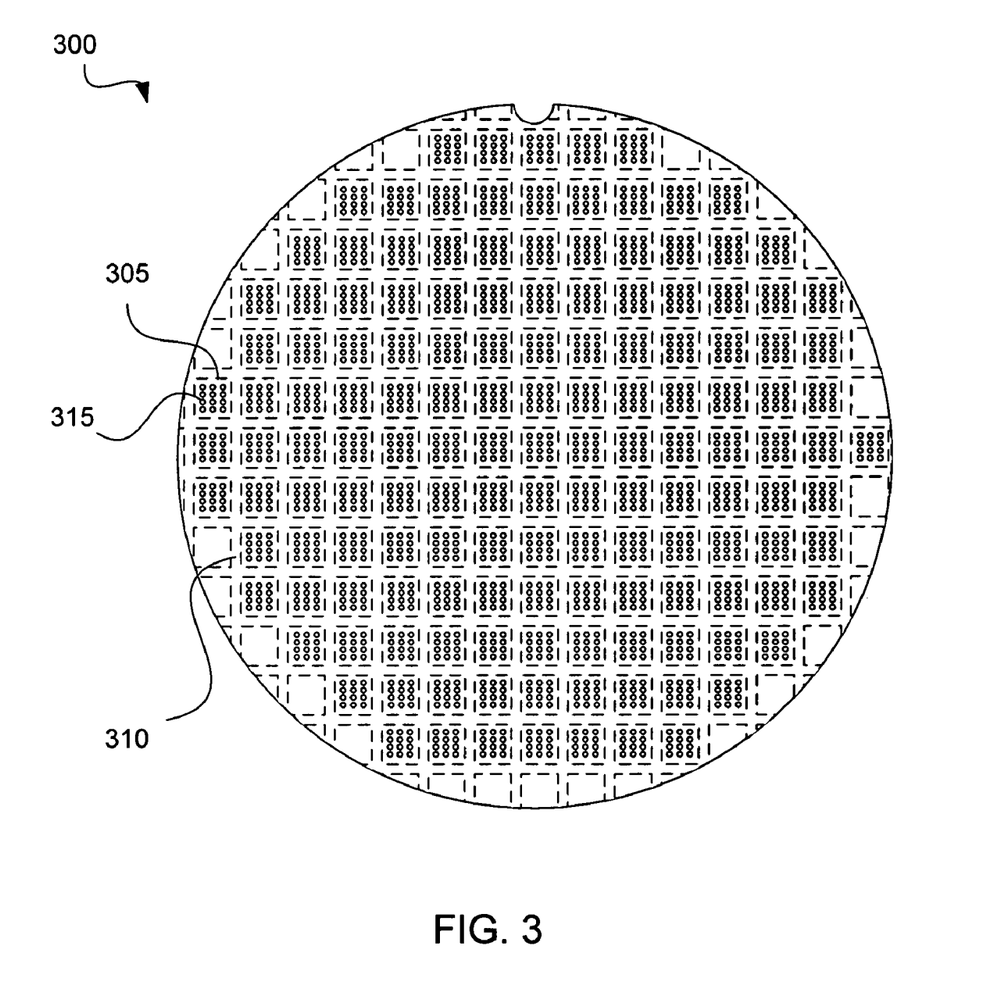
FIG. 3 is a diagrammatic plan view of a semiconductor wafer containing an array of flipchips.

FIG. 3 is a diagrammatic plan view of an exemplary semiconductor wafer 300 that can be used in the present invention. The wafer 300 contains an array of semiconductor dice. Each die 305 is separated from the other dice by saw streets 310, which are where the wafer 300 will be cut during the dicing process. The dice are designed to be in a flipchip assembly and each die 305 has a set of conductive bumps 315. A flipchip assembly is generally defined as the direct electrical connection of face-down ("flipped") electronic components onto substrates by means of conductive bumps. A "mother chip" is the substrate in a multichip assembly.

Common conductive bumps include solder bumps, plated bumps, stud bumps and adhesive bumps. The conductive bumps not only provide an electrically conductive path from the flipchip to the substrate, but can also provide thermally conductive paths to carry heat from the flipchip to the substrate and act as part of the mechanical mounting of the flipchip to the substrate.

Figure 4:
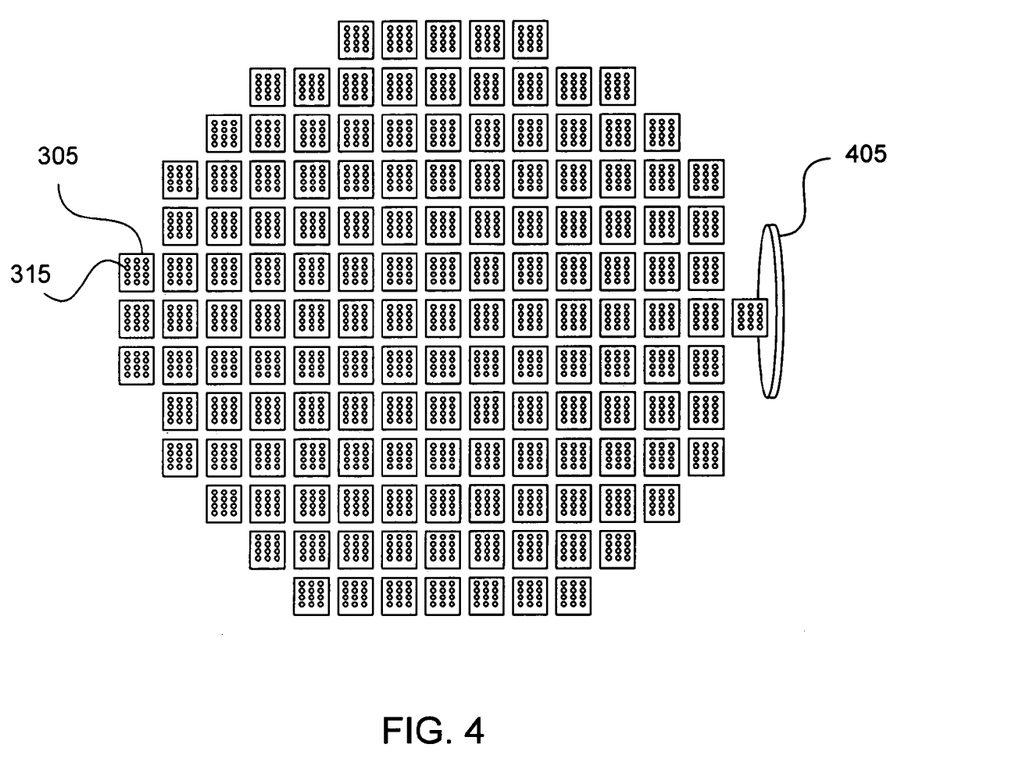
FIG. 4 is a diagrammatic plan view of a semiconductor wafer illustrated in FIG. 3 after singulation.

One of the benefits to using a flipchip assembly is that most of the processing can be completed on the wafer level. FIG. 4 is a diagrammatic plan view of the exemplary semiconductor wafer 300 after it has been singulated with a saw 405. Once the flipchips are singulated, they are ready to be attached to a substrate.

It should be noted that in the illustrated wafer 300, only a relatively small number of dice are shown. However, as will be appreciated by those skilled in the art, state of the art wafers typically include hundreds or thousands of dice on a single wafer.

Figure 5:
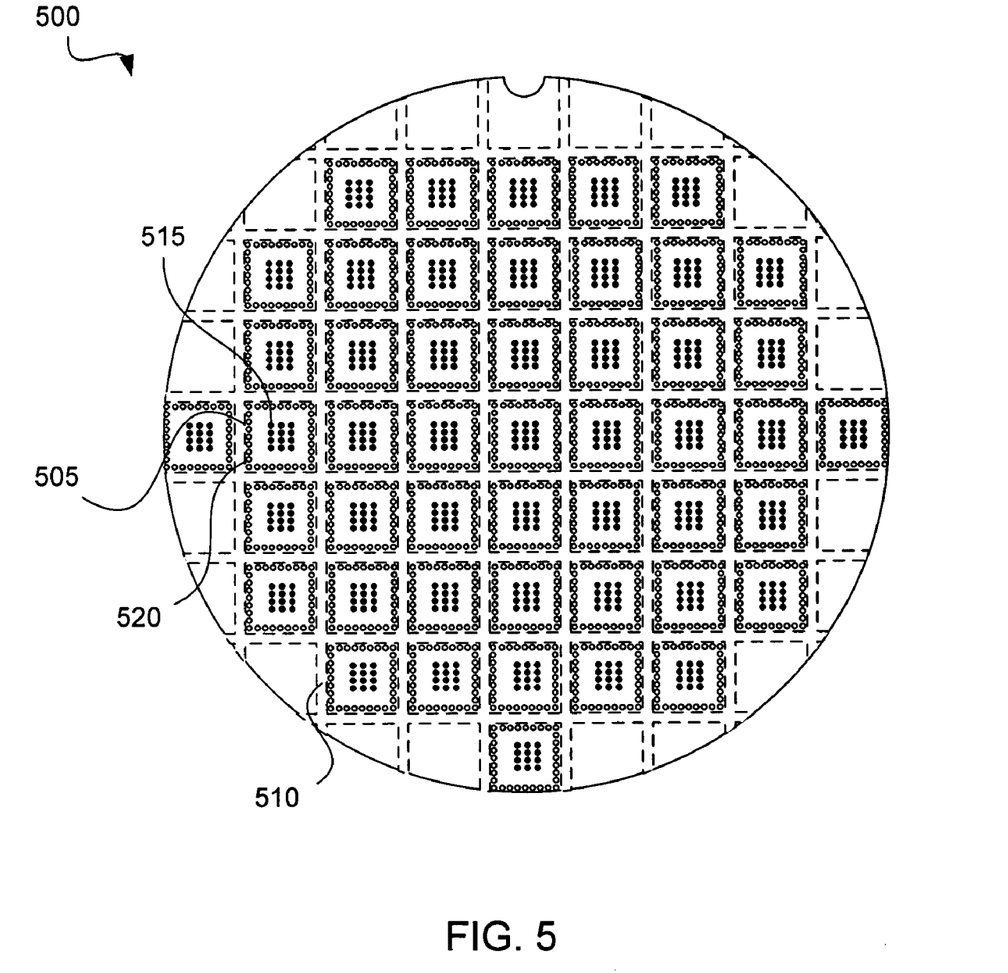
FIG. 5 is a diagrammatic plan view of a semiconductor wafer that can be used as a substrate for the singulated flipchips of FIG. 4.

FIG. 5 is a diagrammatic plan view of an exemplary semiconductor wafer 500 that can be used as the substrate for flipchips that are created after singulating the wafer 300 of FIG. 3. The wafer/substrate 500 contains an array of semiconductor dice with each die 505 separated from other dice by saw streets 510. Each die 505 will eventually function as a mother die 505, and is designed to receive the conductive bumps 315 of the flipchip 305 (the daughter die) on substrate pads 515. Each mother die 505 additionally has bonding pads 520 that are eventually used to electrically connect the mother die 505 with package leads.

Figure 6:
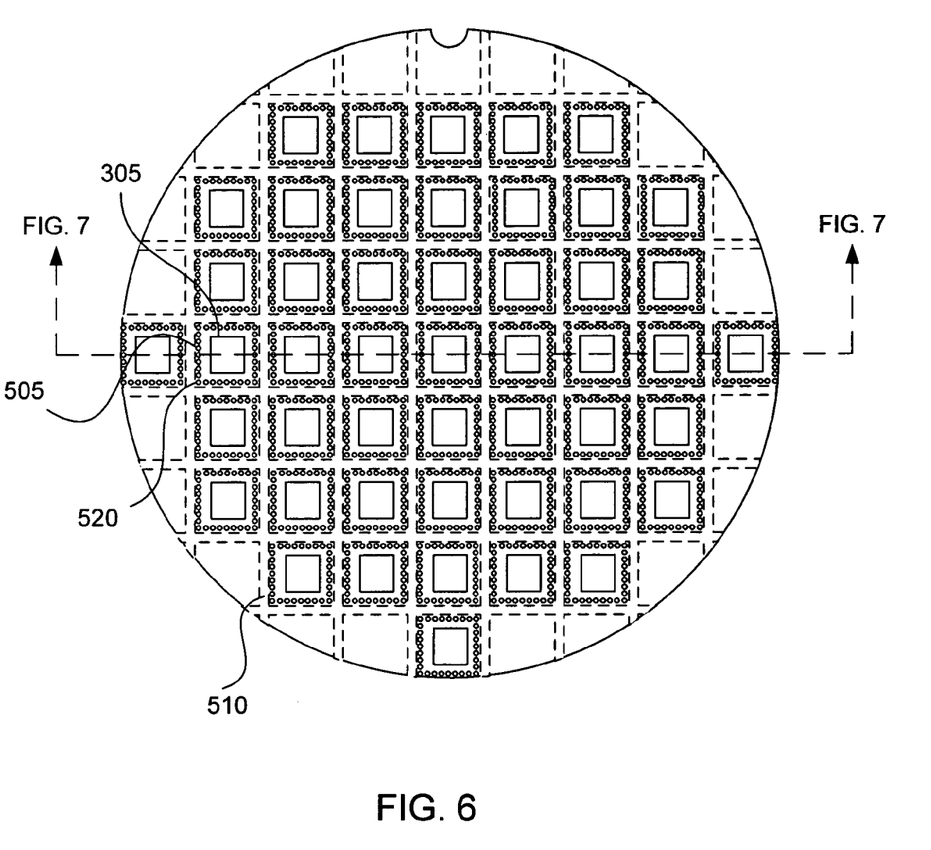
FIG. 6 is a diagrammatic plan view of the semiconductor wafer of FIG. 5 after attachment of the singulated flipchips of FIG. 4.
Figure 7A:
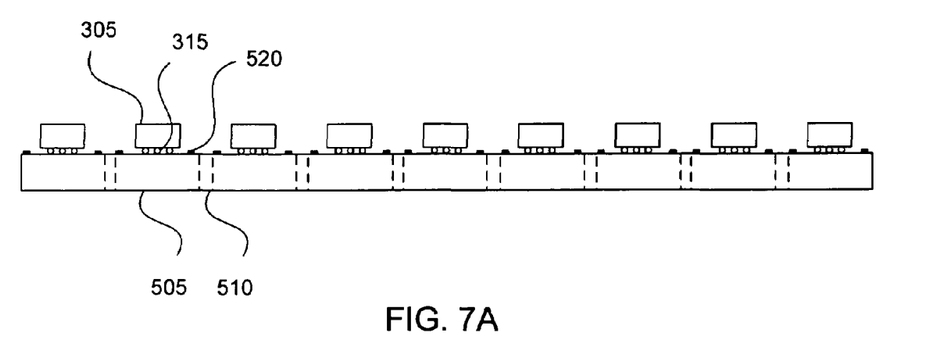
FIG. 7A is a diagrammatic cross sectional view of the wafer of FIG. 6.
Figure 7B:
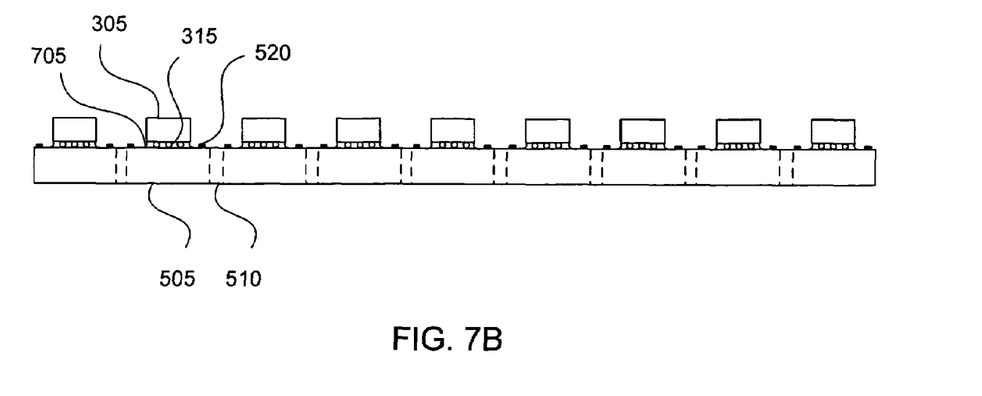
FIG. 7B is a diagrammatic cross sectional view of the wafer of FIG. 6 if underfill material is used.

FIG. 6 is a diagrammatic plan view of the wafer 500 after flipchip attachment. The attachment process may or may not include underfill material. FIGS. 7A and 7B are diagrammatic cross sectional views of the wafer 500 of FIG. 6. In FIG. 7A no underfill material is used, and in FIG. 7B, an underfill 705 is used between the flipchip 305 and the mother die 505. The underfill 705 is useful if the mechanical bond between the conductive bumps 315 of the flipchip 305 and the substrate pads 515 of the mother die 505 are not strong enough to withstand singulation of the wafer 500 or other assembly operations.

Figure 8A:
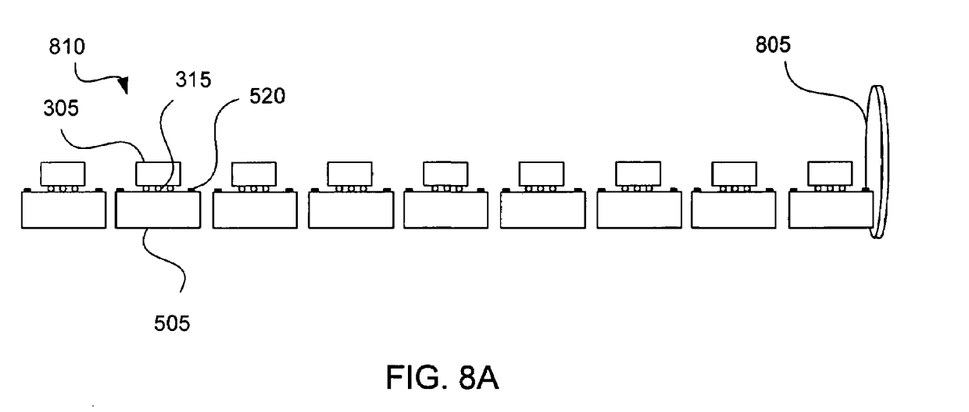
FIG. 8A is a diagrammatic cross sectional view of the wafer of 7A after singulation.
Figure 8B:
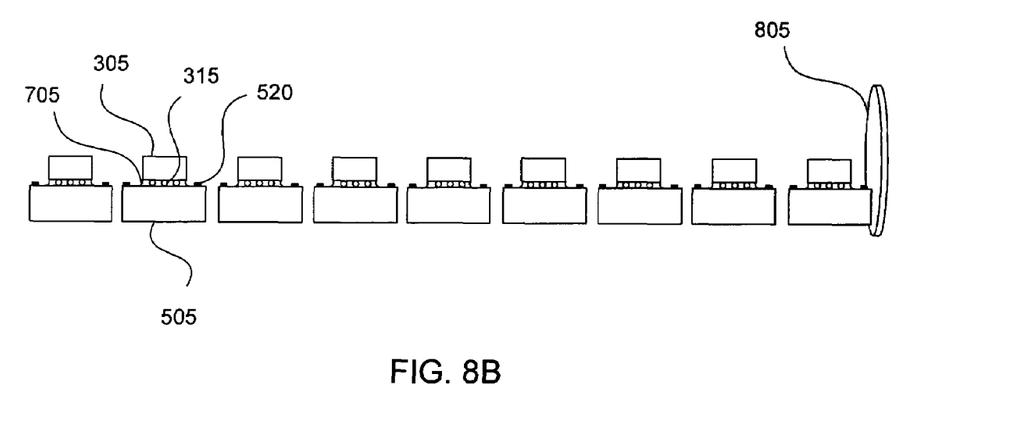
FIG. 8B is a diagrammatic cross sectional view of the wafer of 7B after singulation.

FIGS. 8A and 8B are diagrammatic cross sectional views of the wafer 500 and flipchip after singulation with a saw 805. FIG. 8A is a shows the flipchips attached to mother dice without any underfill material, and FIG. 8B shows the flipchips attached to mother dice using underfill material 705.

Figure 9A:
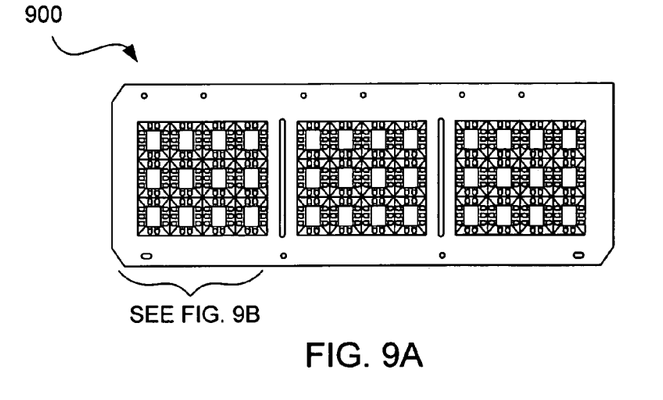
FIG. 9A is a diagrammatic plan view of a leadless leadframe panel.
Figure 9B:
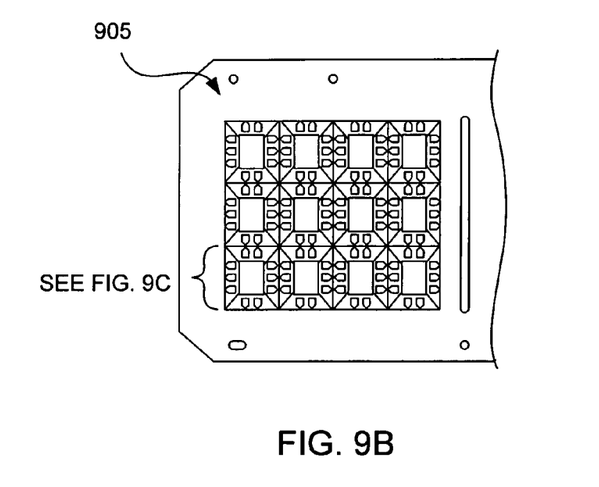
FIG. 9B is a diagrammatic plan view of a device area array in an enlargement of FIG. 9A.
Figure 9C:
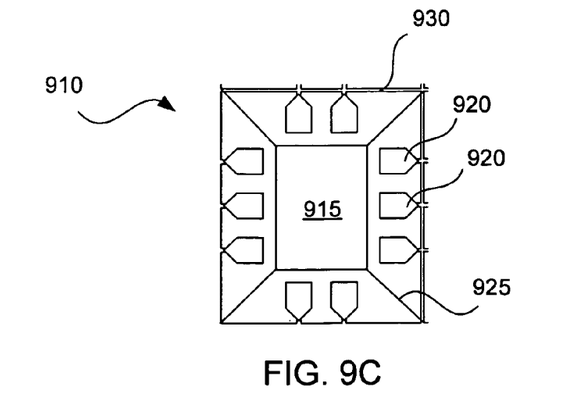
FIG. 9C is a diagrammatic plan view of a device area in an enlargement of FIG. 9B.

Once singulated, the chip stacks 810 are packaged. FIG. 9A is a diagrammatic plan view of a leadless leadframe panel 900. A leadless leadframe package ("LLP") is a relatively new integrated circuit package design that contemplates the use of a conductive (typically copper) leadframe-type substrate structure in the formation of a chip scale package ("CSP"). The resulting packages are sometimes referred to as quad flat packs—no lead (QFN) packages. The leadless leadframe panel 900 is patterned (typically by stamping or etching) to define a plurality of device areas, which form semiconductor device area arrays. FIG. 9B is a diagrammatic plan view of a device area array 905 in an enlarged view of the leadless leadframe panel 900. FIG. 9C is a diagrammatic plan view of a device area 910 isolated from the device area array 905. Each device area 910 includes a die attach pad 915 and a plurality of contacts 920 disposed about their associated die attach pad 915. Very fine tie bars 925 are used to support the die attach pad 915 and very fine support bars 930 are used to support the contacts 920.

Figure 10:
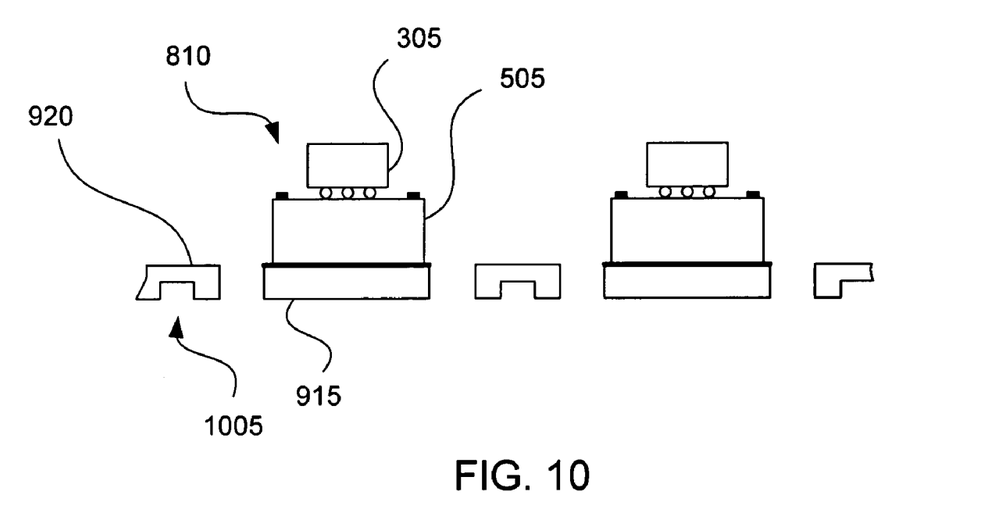
FIG. 10 is a diagrammatic cross section view of the singulated chip stacks of FIG. 8A after attachment on the leadless leadframe panel of FIGS. 9A–9C.

FIG. 10 is a diagrammatic cross sectional view of the chip stack 810 on a die attach pad 915 of the leadless leadframe panel 900. The bottom of the contacts 920 of the leadframe panel 900 are shown being half-etched 1005. Those skilled in the art will appreciate that different styles of leadless leadframe panels can be used, including those that are half-etched on the top of the contacts and those with solid contacts (no half-etching).

Figure 11:
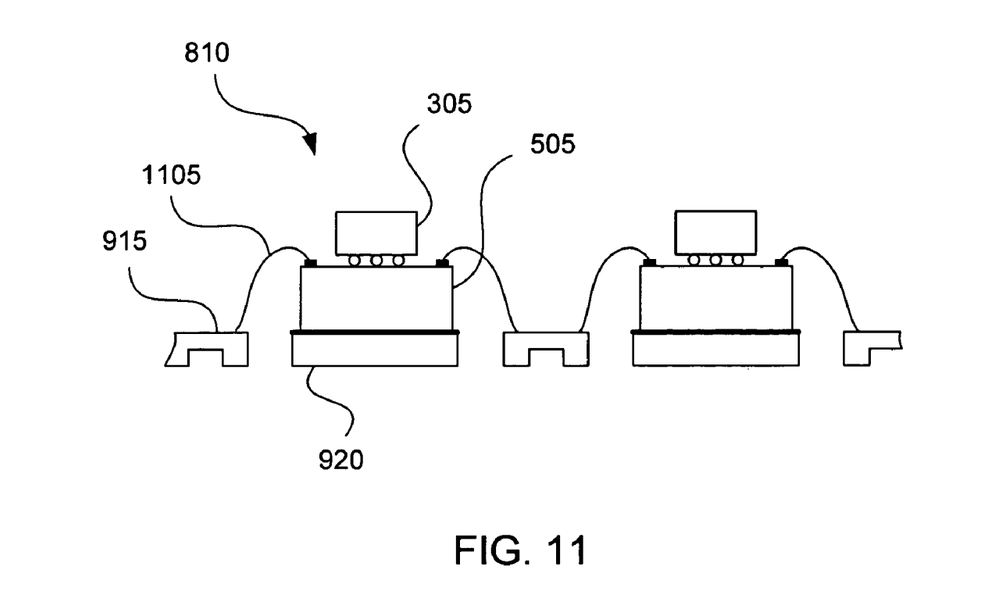
FIG. 11 is a diagrammatic cross sectional view of the mounted chip stacks of FIG. 10 after wire bonding.

Once the entire leadframe panel 900 is populated with chip stacks, the mother chips are electrically connected to the contacts 920. FIG. 11 is a diagrammatic cross sectional view of the chip stack 810 electrically coupled to the contacts 920 with gold wire bonds 1105. It should be appreciated that TAB or other suitable mechanisms could be used to electrically couple the mother chip 505 to the contacts 920.

Figure 12:
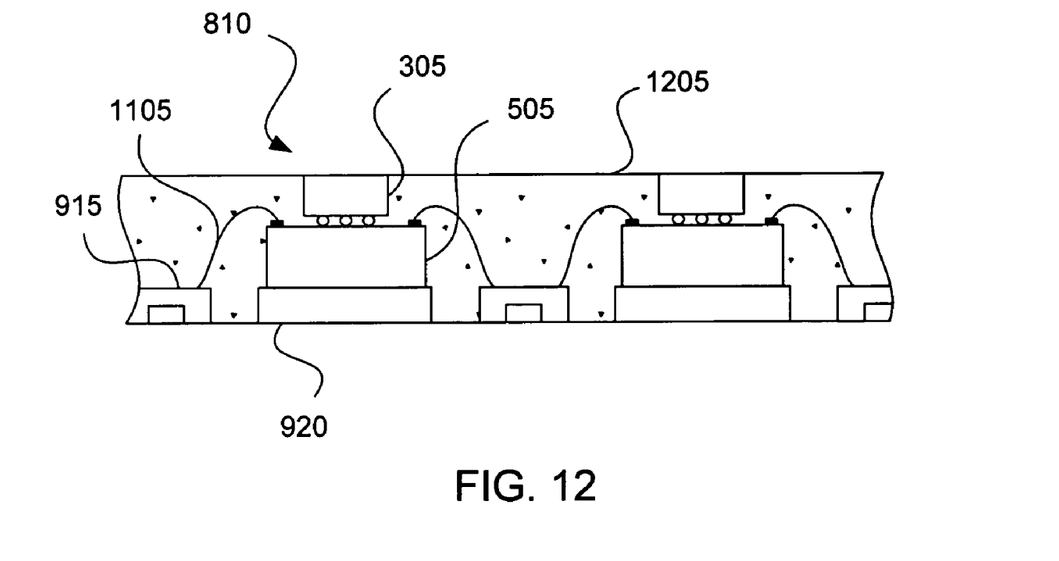
FIG. 12 is a diagrammatic cross sectional view of the mounted chip stacks of FIG. 11 after encapsulation.

FIG. 12 is a diagrammatic cross sectional view of the chip stack 810 and leadless leadframe panel 900 after encapsulation. Typically, an opaque plastic is used as an encapsulant 1205. The encapsulant 1205 serves several purposes, including holding the gold wire bonds 1105 in place, protecting the chip stack 810 and, if no underfill material 705 was used, ensuring the flipchip 305 is held to the mother chip 505.

If the gold wire bonds 1105 do not extend beyond the height of the flipchip 305, the encapsulant 1205 does not need to be filled beyond the height of the flipchip 305. Therefore, the back of the flipchip 305 can be either completely or partially exposed.

Figure 13:
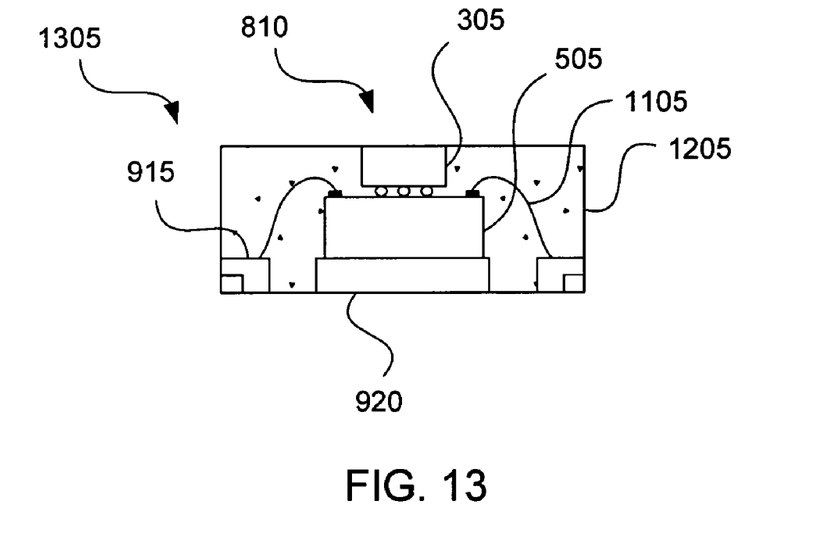
FIG. 13 is a diagrammatic cross sectional view of the mounted chip stacks of FIG. 12 after singulation.

FIG. 13 is a diagrammatic cross sectional view of the final multichip assembly 1305. After the encapsulant 1205 hardens, the packages 1305 are singulated from each other.

Figure 14:
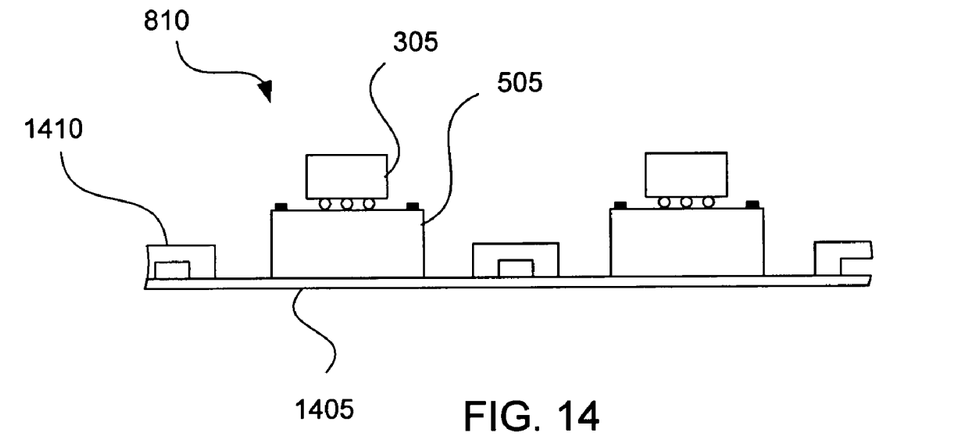
FIG. 14 is a diagrammatic cross section view of the singulated chip stacks of FIG. 8A after attachment to a temporary tape substrate.
Figure 15:
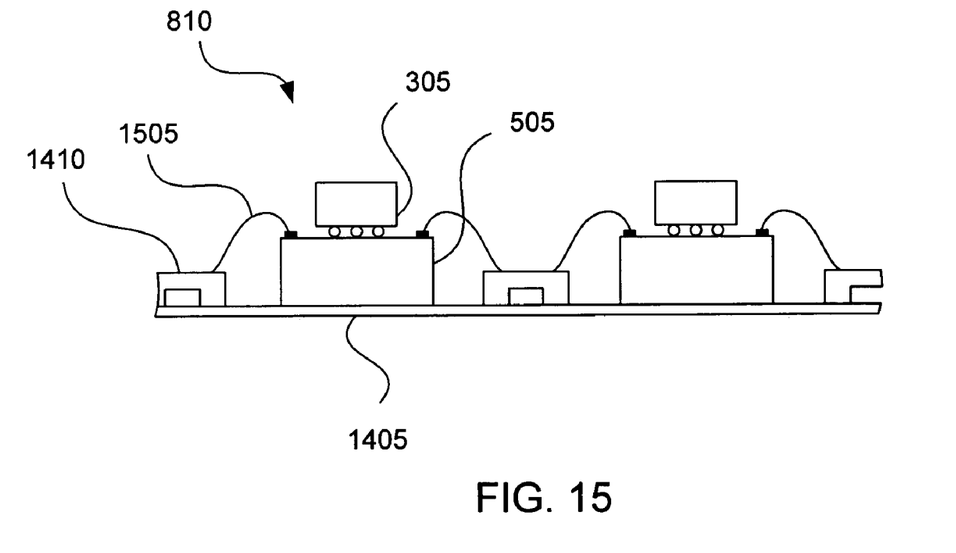
FIG. 15 is a diagrammatic cross sectional view of the chip stacks of FIG. 14 after wire bonding.
Figure 16:
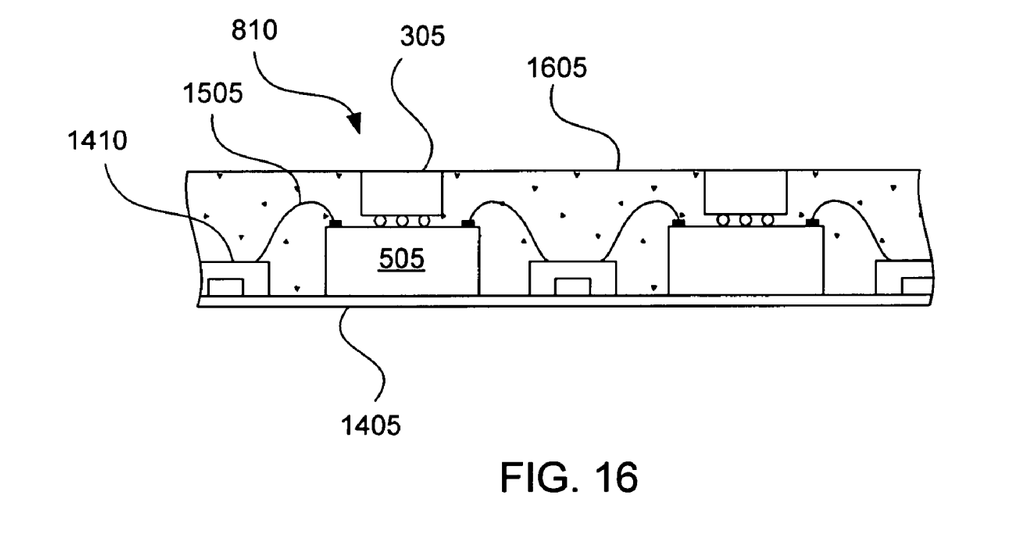
FIG. 16 is a diagrammatic cross sectional view of the mounted chip stacks of FIG. 15 after encapsulation.
Figure 17:
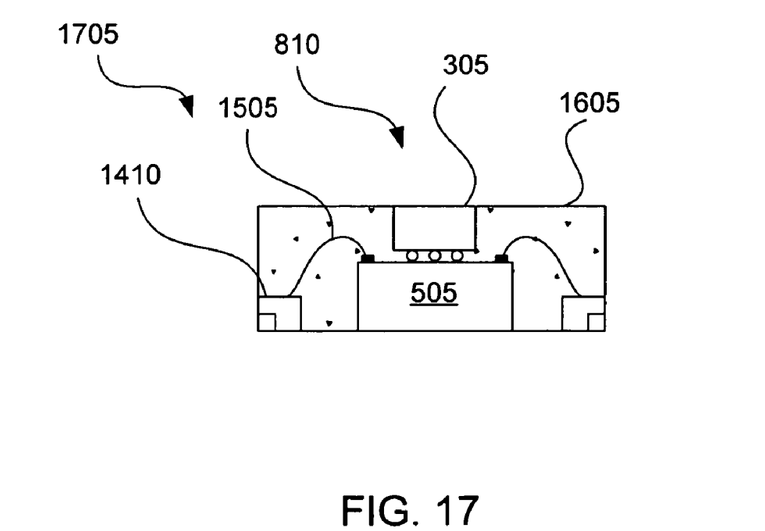
FIG. 17 is a diagrammatic cross sectional view of the mounted chip stacks of FIG. 16 after singulation.

The final multichip assembly 1305 of FIG. 13 can be made even thinner by eliminating the die attach pad 920. FIG. 14 is a diagrammatic cross sectional view of the chip stack 810 on a temporary tape substrate 1405. The temporary tape substrate 1405 is underneath a DAPless leadless leadframe panel 1410 that does not have a die attach pad. FIG. 15 is a diagrammatic cross sectional view of the chip stack 810 in electrical contact with the DAPless leadless leadframe panel 1410. FIG. 16 is a diagrammatic cross sectional view of the chip stack 810 and DAPless leadless leadframe panel 1410 after encapsulation with an encapsulant 1605. FIG. 17 is a diagrammatic cross sectional view of the final DAPless multichip assembly 1705 after singulation and the temporary tape substrate 1405 has been removed. Clearly, the final DAPless multichip assembly 1705 is thinner than the final multichip assembly 1305 shown in FIG. 13 because of that assembly's inclusion of the die attach pad 915.

Figure 18:
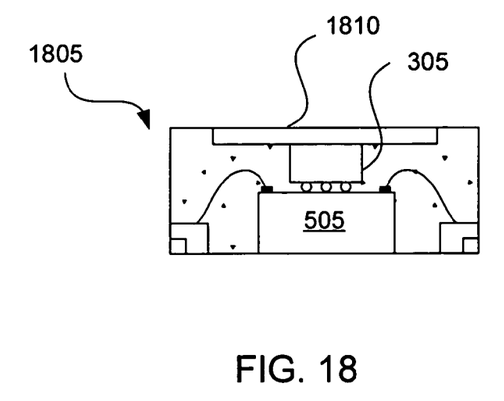
FIG. 18 is a diagrammatic cross sectional view of a package that includes a heat spreader.

FIG. 18 is a diagrammatic cross sectional view of another multichip assembly 1805 in accordance with another embodiment of the invention. A heat spreader 1805, which is typically a thin layer of metal, is attached to the back of the flipchip 305 in order to improve thermal performance.

Figure 19:
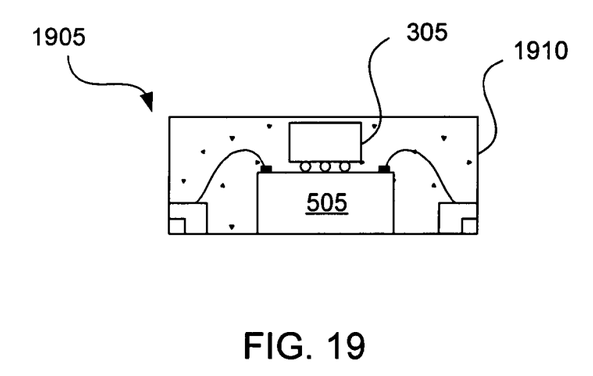
FIG. 19 is a diagrammatic cross sectional view of a package that maintains a thin layer of encapsulant over the chip stack.

FIG. 19 is a diagrammatic cross sectional view of another multichip assembly 1905 in accordance with another embodiment of the invention. A thin layer of encapsulant 1910 covers the back of the flipchip 305 in order to provide additional shielding for the flipchip 305.

Figure 20:
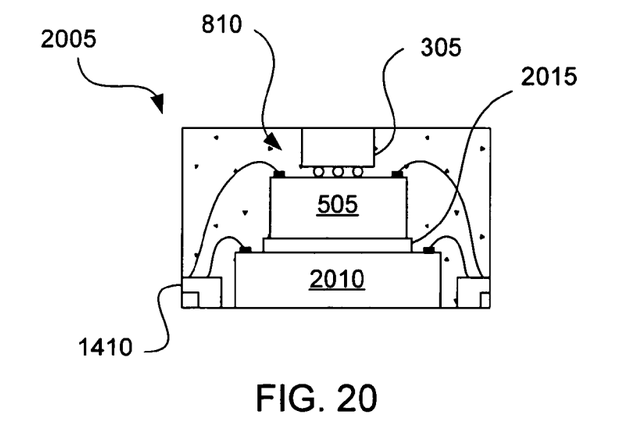
FIG. 20 is a diagrammatic cross sectional view of a package that includes an additional die.

FIG. 20 is a diagrammatic cross sectional view of another multichip assembly 2005 in accordance with another embodiment of the invention in which an additional die 2010 is included in the multichip assembly 2005. A spacer 2015 separates the additional die 2010 from the mother die 505 of the chip stack 810. The mother die 505 and the additional die 2010 are both electrically connected to the DAPless leadless leadframe panel 1410.

Although illustrative embodiments and applications of this invention are shown and described herein, many variations and modifications are possible which remain within the concept, scope, and spirit of the invention, and these variations would become clear to those of ordinary skill in the art. For example, the chips can be individually molded and mechanically singulated. Also, in certain applications it might be beneficial to use well known modifications, such as a clear mold compound as the encapsulant for imaging applications or back-coating the exposed dice in order to prevent light from interfering with the circuitry. Accordingly, the present embodiments are to be considered as illustrative and not restrictive, and the invention is not to be limited to the details given herein, but may be modified within the scope and equivalents of the appended claims.

What is claimed is:

1. A method of packaging integrated circuits comprising:
   providing a semiconductor wafer that has an any of mother dice formed therein
   mounting a multiplicity of singulated daughter dice on the wafer, wherein each daughter die is mounted on an associated mother die and electrically connected to the mother die by direct soldering using a flip chip mounting approach, and wherein the daughter dice have shorter lengths and widths than the mother dice such that the mother dice have at least some contacts that are exposed relative to their respective daughter dice;
   dicing the semiconductor wafer having daughter dice mounted onto the mother dice on the wafer to create a multiplicity of individual chip stacks;
   positioning a selected plurality of the chip stacks on a lead frame panel having a multiplicity of device areas, wherein each selected chip stack is positioned in an associated device area;
   electrically connecting the exposed contacts on the mother dice of the selected chip stacks to contacts within their associated device area;
   encapsulating the device areas of the lead frame panel; and
   singulating the device areas after the encapsulation to create a multiplicity of individual stacked multi-chip packages.

2. The method of claim 1, wherein the resulting multi-chip packages are quad flat packs—no lead packages.

3. The method of claim 2, wherein the positioning of the selected chip stack includes placing the selected chip stacks on a temporary tape substrate that is adhered to a back surface of the lead frame panel, the method further comprising removing the temporary tape substrate after the encapsulation.

4. The method of claim 1, further comprising underfilling the regions beneath the daughter dice between the daughter and mother dice at the wafer level.

5. A method as recited in claim 1 wherein the encapsulation covers back surfaces of the daughter dice.

6. A method as recited in claim 1 wherein the encapsulation is arranged to expose back surfaces of the daughter dice.

7. A method as recited in claim 1, further comprising applying heat spreaders to back surfaces of the daughter dice before the encapsulation.

8. A method as recited in claim 1, wherein the wafer having the array of mother dice has not been diced or singulated prior to the mounting of the daughter dice.

* * * * *

UNITED STATES PATENT AND TRADEMARK OFFICE
CERTIFICATE OF CORRECTION

PATENT NO.          : 7,144,800 B2                                           Page 1 of 1
APPLICATION NO. : 10/890896
DATED               : December 5, 2006
INVENTOR(S)         : Mostafazadeh et al.

It is certified that error appears in the above-identified patent and that said Letters Patent is hereby corrected as shown below:

In line 2 of claim 1 (column 6, line 7) change "an any" to --an array--.

Signed and Sealed this

Eighteenth Day of September, 2007

JON W. DUDAS
*Director of the United States Patent and Trademark Office*